US008288293B2

(12) United States Patent
Pham et al.

(10) Patent No.: US 8,288,293 B2
(45) Date of Patent: Oct. 16, 2012

(54) INTEGRATED CIRCUIT FABRICATION USING SIDEWALL NITRIDATION PROCESSES

(75) Inventors: Tuan Pham, San Jose, CA (US); Sanghyun Lee, Davis, CA (US); Masato Horiike, Mie (JP); Klaus Schuegraf, San Jose, CA (US); Masaaki Higashitani, Cupertino, CA (US); Keiichi Isono, Mie (JP)

(73) Assignee: SanDisk Technologies Inc., Plano, TX (US)

( * ) Notice: Subject to any disclaimer, the term of this patent is extended or adjusted under 35 U.S.C. 154(b) by 104 days.

(21) Appl. No.: 12/763,963

(22) Filed: Apr. 20, 2010

(65) Prior Publication Data

US 2010/0270608 A1 Oct. 28, 2010

Related U.S. Application Data

(60) Provisional application No. 61/171,052, filed on Apr. 20, 2009.

(51) Int. Cl.
*H01L 21/469* (2006.01)

(52) U.S. Cl. ........................................ 438/775

(58) Field of Classification Search .......... 438/589, 438/424, 769, 775, 444, 265, 264
See application file for complete search history.

(56) References Cited

U.S. PATENT DOCUMENTS

| | | | |
|---|---|---|---|
| 6,008,091 A | 12/1999 | Gregor et al. | |
| 6,512,263 B1 * | 1/2003 | Yuan et al. | 257/316 |
| 6,753,224 B1 | 6/2004 | Lin | |
| 6,855,994 B1 | 2/2005 | King et al. | |
| 7,015,534 B2 | 3/2006 | Colombo | |
| 7,026,684 B2 | 4/2006 | Sakuma et al. | |
| 7,202,125 B2 | 4/2007 | Pham et al. | |
| 7,582,529 B2 | 9/2009 | Matamis et al. | |
| 7,592,223 B2 | 9/2009 | Pham et al. | |
| 7,592,225 B2 | 9/2009 | Kai et al. | |
| 7,704,832 B2 | 4/2010 | Kai et al. | |
| 2005/0079696 A1 | 4/2005 | Colombo | |
| 2005/0087795 A1 | 4/2005 | Sakuma et al. | |
| 2005/0227437 A1 * | 10/2005 | Dong et al. | 438/265 |
| 2007/0066084 A1 * | 3/2007 | Wajda et al. | 438/765 |
| 2007/0141780 A1 * | 6/2007 | Higashitani | 438/257 |
| 2007/0298568 A1 | 12/2007 | Mokhlesi | |
| 2008/0061353 A1 | 3/2008 | Oh et al. | |
| 2008/0149987 A1 | 6/2008 | Alapati et al. | |
| 2008/0171406 A1 | 7/2008 | Orimoto et al. | |
| 2008/0248622 A1 | 10/2008 | Matamis et al. | |
| 2010/0081267 A1 | 4/2010 | Purayath et al. | |

* cited by examiner

*Primary Examiner* — A. Sefer
*Assistant Examiner* — Nikolay Yushin
(74) *Attorney, Agent, or Firm* — Vierra Magen Marcus & DeNiro LLP

(57) ABSTRACT

Semiconductor devices are provided with encapsulating films for protection of sidewall features during fabrication processes, such as etching to form isolation regions. In a non-volatile flash memory, for example, a trench isolation process is divided into segments to incorporate an encapsulating film along the sidewalls of charge storage material. A pattern is formed over the layer stack followed by etching the charge storage material to form strips elongated in the column direction across the substrate, with a layer of tunnel dielectric material therebetween. Before etching the substrate, an encapsulating film is formed along the sidewalls of the strips of charge storage material. The encapsulating film can protect the sidewalls of the charge storage material during subsequent cleaning, oxidation and etch processes. In another example, the encapsulating film is simultaneously formed while etching to form strips of charge storage material and the isolation trenches.

18 Claims, 14 Drawing Sheets

FIG. 1 *(Prior Art)*      FIG. 2 *(Prior Art)*
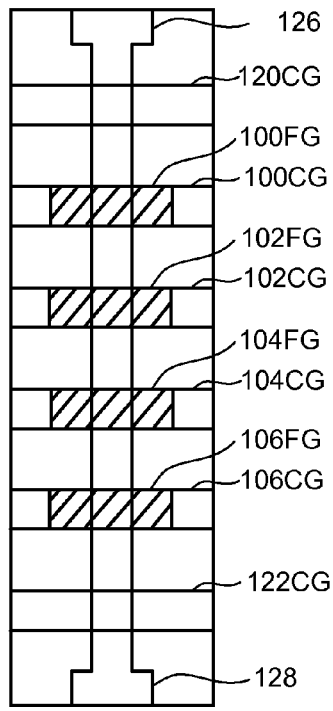
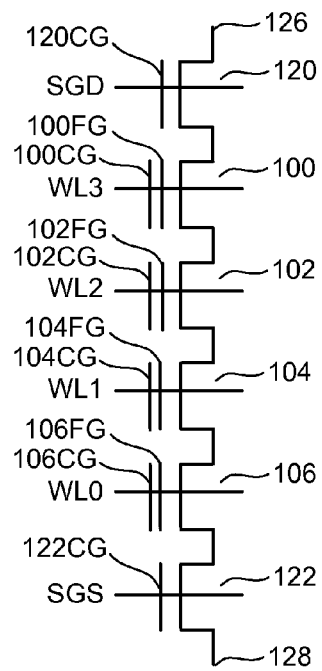
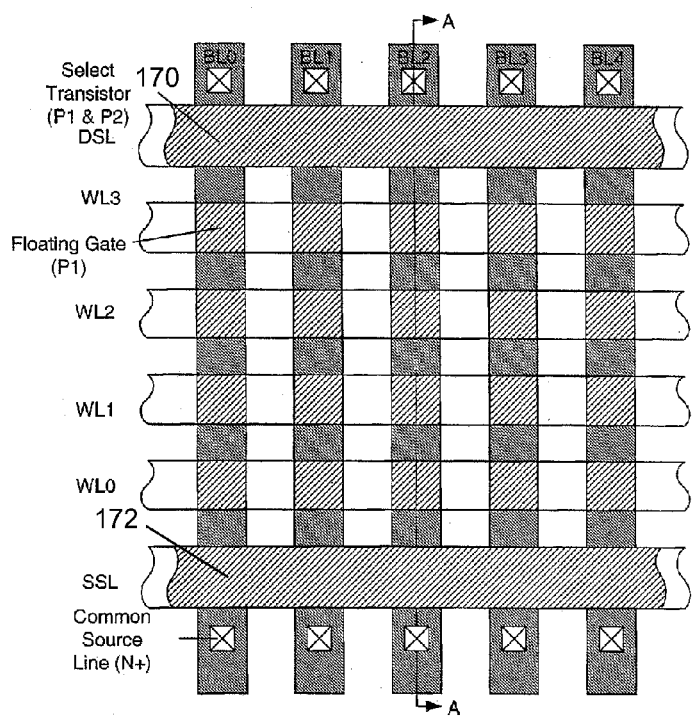
FIG. 3

Memory Array (x-axis) | Peripheral Circuitry (x-axis)

Memory Array (x-axis) | Peripheral Circuitry (x-axis)

INTEGRATED CIRCUIT FABRICATION USING SIDEWALL NITRIDATION PROCESSES

CLAIM OF PRIORITY

The present application claims priority from U.S. Provisional Patent Application No. 61/171,052, entitled "Novel Flash FG Sidewall Nitridation to Enhance Yield and Cell Reliability," by Pham et al., filed Apr. 20, 2009, incorporated by reference herein in its entirety.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

BRIEF DESCRIPTION OF THE DRAWINGS

FIG. 1 is a top view of a NAND string.

FIG. 2 is an equivalent circuit diagram of the NAND string depicted in FIG. 1.

FIG. 3 is a plan view of a portion of a NAND flash memory array.

DETAILED DESCRIPTION

Figure 4:
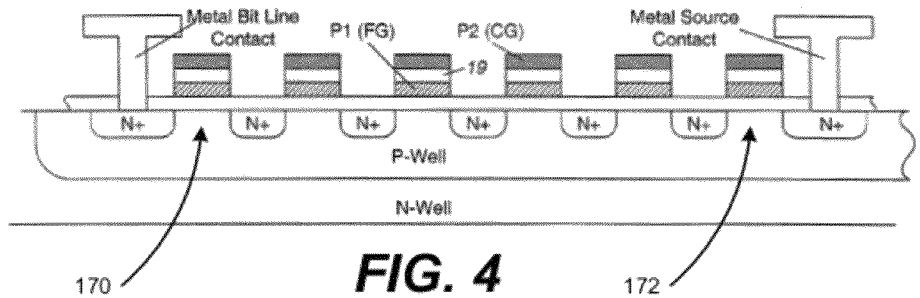
FIG. 4 is an orthogonal cross-sectional view taken along line A-A of the portion of the flash memory array depicted in FIG. 3.

High density semiconductor devices are provided with encapsulating films for protection of sidewall features during fabrication processes, such as etching to form isolation regions. In a non-volatile flash memory, for example, a trench isolation process is divided into segments to incorporate an encapsulating film along the sidewalls of charge storage material. A pattern is formed over the layer stack followed by etching the charge storage material to form strips elongated in the column direction across the substrate, with a layer of tunnel dielectric material therebetween. Before etching the substrate, and optionally before etching the tunnel dielectric layer, an encapsulating film is formed along the sidewalls of the strips of charge storage material. The encapsulating film can protect the sidewalls of the charge storage material during subsequent cleaning, oxidation and etch processes. For example, after forming the encapsulating film, the substrate and tunnel dielectric layer can be etched to form isolation trenches, followed by a post clean operation.

Various encapsulation films are contemplated. In one embodiment, the encapsulation film is a film formed by introducing nitride species to the charge storage material sidewalls to react and form an encapsulating layer. The encapsulating layer can include a nitride such as silicon nitride or other materials such as silicon oxynitride. Silicon oxynitride can avoid the formation of charge trap regions around the charge storage material. In various embodiment, the film can range in thickness. By way of example, suitable films are formed with thicknesses of less than 1 nm in one embodiment. Other embodiments can include films having a thickness of 1 nm-4 nm. Other thicknesses can be used.

In one embodiment, a slot plane antenna (SPA) nitridation process is used to introduce nitride species. The nitride species can react with a polysilicon floating gate layer to form a silicon oxynitride encapsulating film. SPA nitridation can be used to create very thin films with uniform thickness and properties. Other nitridation process can be used. In another embodiment, nitrogen species are introduced with the etch chemistry while etching the charge storage material and substrate to form an encapsulating film. In this fashion, an additional SPA nitridation machine is not required. The process can be performed with etching to simultaneously form strips of charge storage material and the isolation trenches.

The fabrication processes described have application to all types of semiconductor based devices, and can be used in the fabrication of various types of memory (e.g., NOR-based memory arrays) and other devices. Devices using sidewall transfer technology for scaled devices can benefit from the disclosed encapsulating technology to reduce unwanted sidewall etching, pull-back and bowing. Active area allocation can be increased by preserving channel width which may otherwise by smaller due to pull-back, etc. Trap sites associated with exposed dielectric regions can be reduced by reducing sidewall attack and pull-back. Yield can be increased by reducing failures associated with sidewall pull-back and bowing. Voids within the isolation regions can be reduced due to less tunnel dielectric and intermediate dielectric bird's beaks, etc.

A portion of a NAND memory array as can be fabricated in accordance with embodiments of the present disclosure is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774, 397 and 6,046,935.

Figure 5:
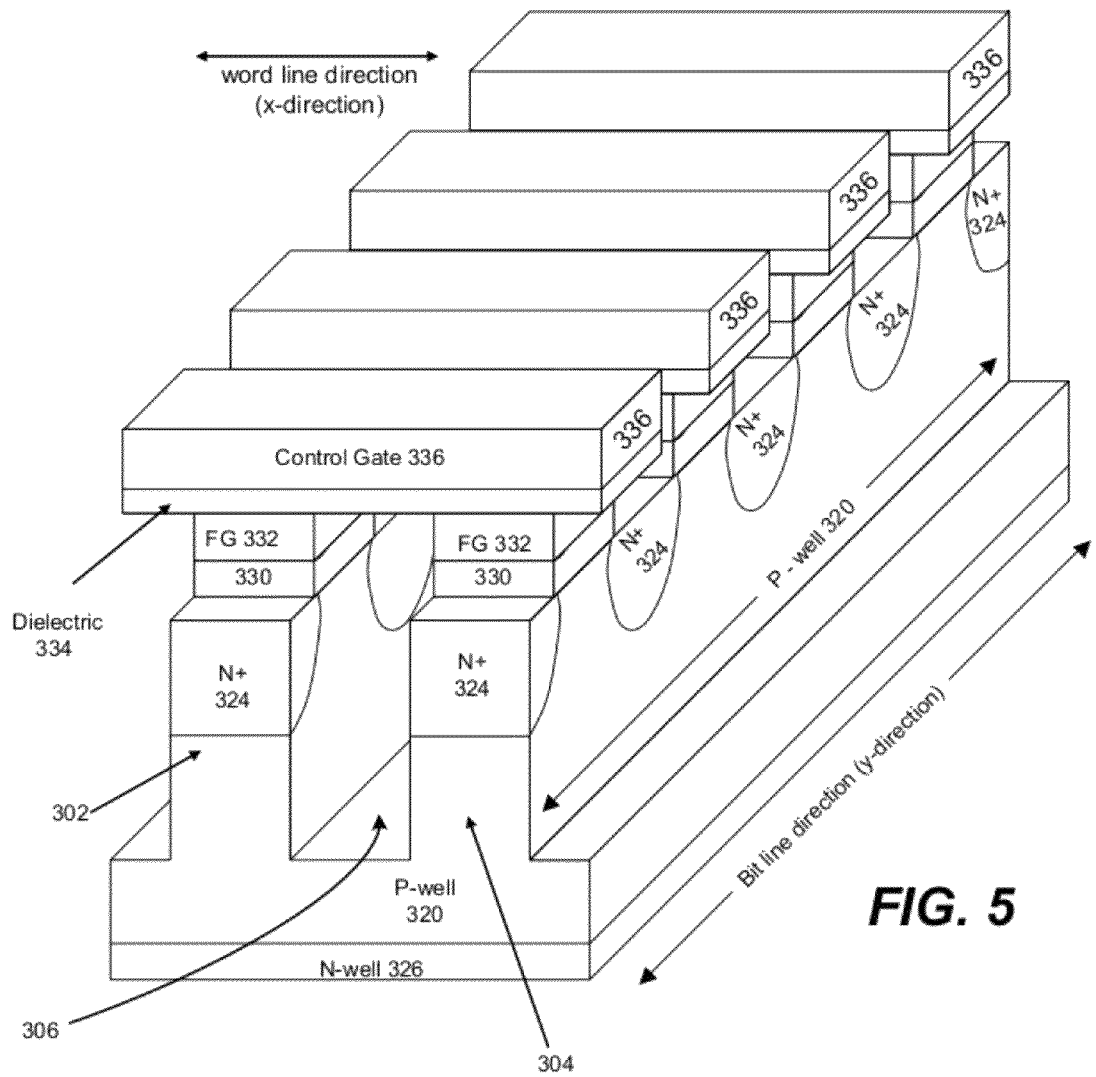
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Figure 6:
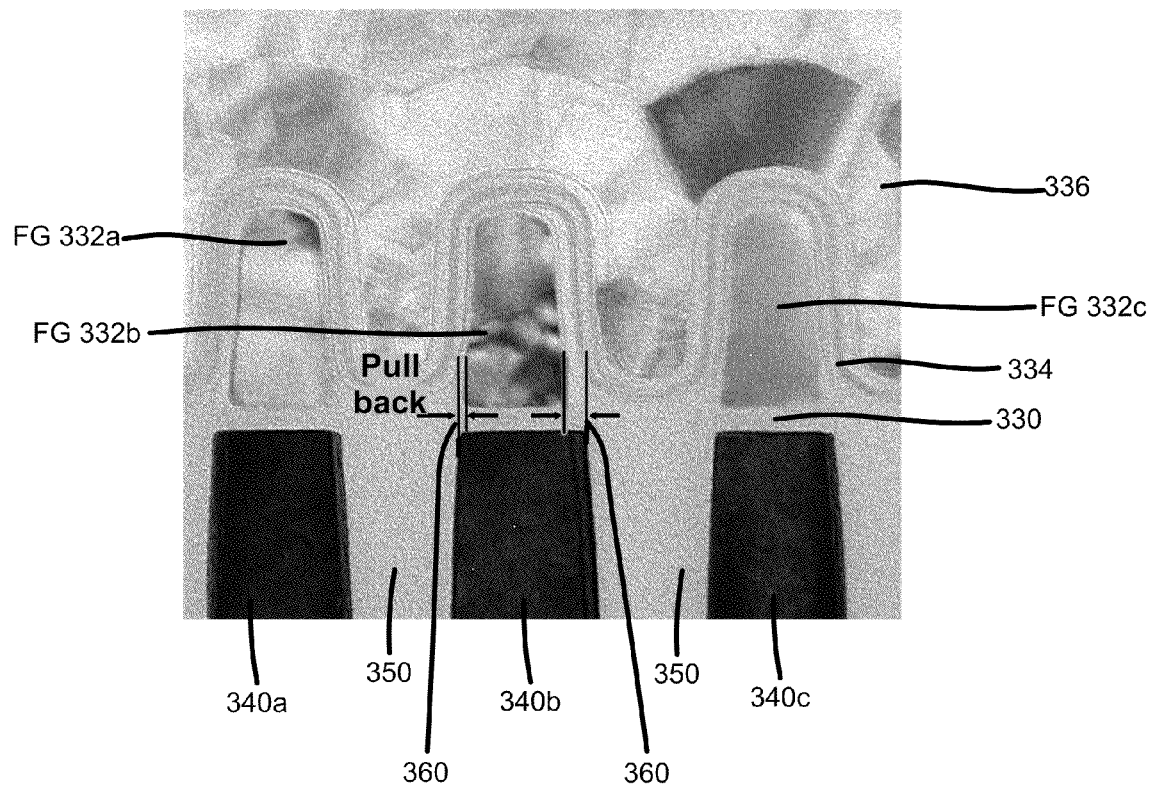
FIG. 6 is a cross-sectional view of a portion of a non-volatile memory array depicting the effects of pull-back on a floating gate.

FIG. 6 is a cross-sectional view of a portion of a NAND memory array in the x-axis direction taken through a portion of a row of memory cells. Floating gate pull-back effects that can result from traditional processing steps to form shallow trench isolation regions are depicted. Floating gates 332a, 332b and 332c are formed over active areas 340a, 340b and 340c of a substrate with a tunnel dielectric layer 330 therebetween. Intermediate dielectric layer 334 separates the floating gates from an overlying word line 336. FIG. 6 depicts substantial misalignment between floating gate 332b and its underlying active area 340b. This misalignment may result from pull-back 360 of the floating gate material during and after etching to form shallow trench isolation regions 350. This misalignment can occur even when a self-aligned process is used to etch the floating gate and isolation trenches with a common pattern.

During reactive ion etching of the layer stack to form columns and of the substrate to form shallow trench isolation areas, many different etch chemistries may be used. The different etch chemistries may attack the sidewalls of the floating gate and result in some amount of pull-back. Additionally, the etch chemistries can result in polymer buildup on the floating gate sidewalls. After etching, cleaning processes are typically used to clean the polymer buildup. These cleaning processes can result in further pull-back of the floating gate sidewalls. Sidewall oxidation is often applied after etching to seal off the floating gate and active area sidewalls. This oxidation, however, may occur faster at the polysilicon floating gate sidewalls resulting in pull-back. In various instances, the pull-back may range from a few nanometers to eight nanometers or more.

As feature sizes continue to be scaled-down, the pull-back of the floating gate can result in decreased memory performance, affecting both write and erase endurance of the device during use, and yield during the manufacturing process. The channel width is decreased as result of the decrease in the floating gate width. With a smaller channel width, the tunneling dielectric area is decreased which concentrates tunneling in a smaller area. Moreover, a small but exposed tunneling dielectric area is created below the pull-back area of the floating gate. Under a high applied electric filed, electron tunneling at the edge of the control gate to the channel through the inter-poly dielectric layer can occur. This edge tunneling can result in W/E cycling degradation.

Figure 7:
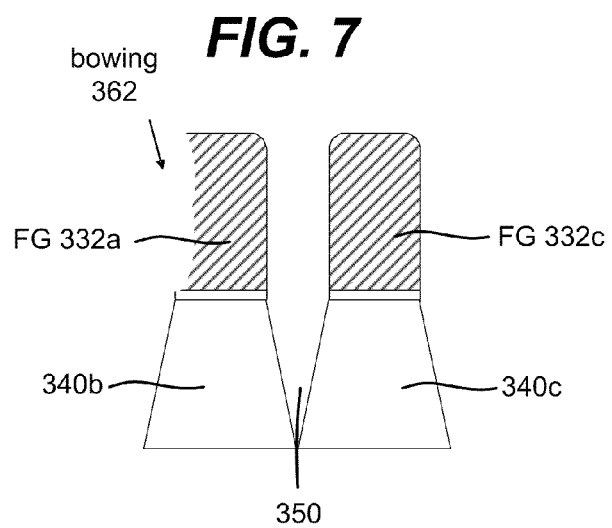
FIG. 7 is a cross-sectional view of a portion of a non-volatile memory array depicting the effects of bowing on a floating gate.

After the floating gate sidewall is damaged and pulls back, the floating gate profile can be adversely affected, as shown in FIG. 7. The sidewall may suffer from bowing 362 as depicted in FIG. 7. A concave profile results in the sidewall. Due to this bowed profile, subsequent layer stacks such as the intermediate dielectric layer may be filled in and result in masking during the layer stack etch processes to define the gate length during subsequent processing. Such masking may result in polysilicon stringers and/or inconsistently high dielectric properties around the intermediate dielectric fence along the active areas. Any polysilicon stringers can impact yields by causing failures in the device. A high intermediate dielectric fence can cause implant shadowing for the memory cells, causing them not to function correctly.

Previous solutions have included the above-mentioned oxidation after the trench isolation etching, but this has resulted in further pull-back in some instances. Other approaches have added nitride layers over the sidewall oxide layer. These approaches may suppress bird beak effects from the floating gate interface with the tunnel dielectric and protect the floating gate sidewalls from damage during subsequent processing. These techniques, however, have not been successful in protecting the sidewalls from pull-back that exposes the oxide underneath, nor from a damaged profile with bowing as shown in FIG. 7. Further, these nitride layers tend to be thick, causing further decreases in the channel width.

Figure 8:
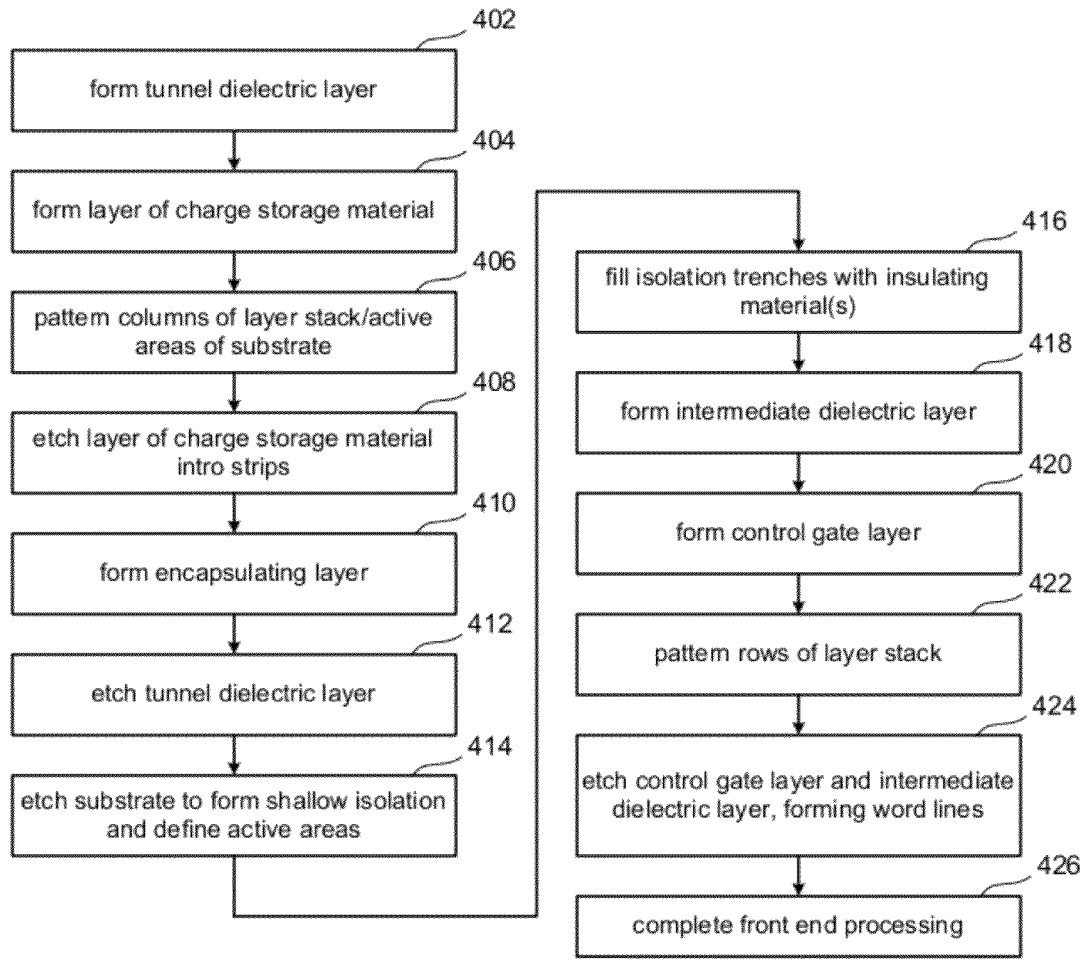
FIG. 8 is a flowchart describing a method of fabricating non-volatile memory in accordance with one embodiment.

FIG. 8 is a flowchart describing a method of fabricating a non-volatile memory array in accordance with one embodiment. Select processing steps are presented with common processing steps known to those of ordinary skill in the art being omitted. At step 402, a tunnel dielectric layer is formed over the surface of the substrate. The tunnel dielectric layer may be formed at a memory array portion of the substrate as well as a peripheral circuitry area of the substrate. One or more portions of the peripheral circuitry may undergo additional processing to form a thicker dielectric area for transistors such as logic gates, high voltage select transistors, etc. A layer of charge storage material is formed over the tunnel dielectric layer at step 404. Additional pad and hard masking layers are generally applied, prior to applying a pattern at the memory array region at step 406. The pattern corresponds to targeted columns of the layer stack and active areas of the substrate. At the peripheral circuitry region, a different pattern may be applied for the transistors being formed at that portion of the substrate.

At step 408, the layer of charge storage material is etched into columns in accordance with the applied pattern and masking. Etching proceeds through the charge storage material but does not etch the substrate. In one embodiment, etching stops before or when the tunnel dielectric layer is reached, although other embodiments may include etching the tunnel dielectric layer. It is noted that unlike traditional processes, this initial column etching at step 408 does not continue into the substrate to form isolation trenches. The etch process is divided into different processes by stopping the etch at step 408 before the trenches are etched.

After etching the charge storage material, a post clean process may be used to clean the floating gate sidewalls, such as to remove polymer buildup. After cleaning, an encapulating layer or film is formed at step 410. Various material can be used for the film. In one example, a silicon nitride encapsulating layer can be formed. In other examples, a silicon oxynitride ($SiO_xN_y$) encapsulating layer or film is formed. The encapsulating layer is formed along the exposed sidewalls of the charge storage material resulting from the etch at step 408. A nitridation process is used in one embodiment to form the silicon nitride or oxynitride layer. It is noted that although a nitridation process is used, an oxynitride and not a pure nitride or silicon nitride layer can be formed. Reactions with a polysilicon floating gate layer and various nitride species may be used to form silicon nitride and silicon oxynitride layers. Oxynitride layers may avoid charge trap areas that can capture electrons during program operations and result in degraded device performance. The ratio of oxygen to nitride in the resulting layer may vary by implementation.

Although the encapsulating layer is described as a layer, it is noted that a very thin layer will result from the reaction with the floating gate sidewalls during the nitridation process. In one embodiment, a slot plane antenna (SPA) nitridation process is used at step 410. In one example of a SPA nitridation technique, an antenna having a slot is used to distribute a nitride species. The configuration of the slot can be adjusted to result in a very uniform nitride layer on the polysilicon. Thus, the properties of the resulting encapsulating layer will be consistent from one memory cell to the next. A variety of nitride species such as $N_2$, $NH_3$, and NO can be used. The nitride species reacts with the polysilicon to form various concentrations of oxygen and nitrogen in the silicon oxynitride. In one embodiment, the encapsulating layer is less than 1 nm in thickness. In another embodiment, the encapsulating layer is between 1 nm and 2 nm in thickness. In yet another embodiment, the encapsulating layer is between 2 nm and 4 nm in thickness. Other thicknesses may be used as well such as thicknesses of more than 4 nm.

After forming the encapsulating layer, the tunnel dielectric layer is etched at step 412, followed by etching isolation trenches at step 414. The encapsulating layer protects the polysilicon floating gate sidewalls during both etch processes, decreasing or eliminating pull-back resulting from these processes. The etch at step 412 and 414 is performed according to the same pattern as that of the charge storage material. After forming the trenches, another post clean process can be applied, followed by bulk ion implantation in the trench portions of the substrate.

After forming the isolation trenches, they are filled with an insulating material at step 416. In one embodiment a high temperate oxide lining is formed in the trenches, followed by filling with a suitable dielectric material such as silicon oxide. Growth and/or deposition processes can be used at step 416. After filling the trenches, processing continues to form individual memory cells. An intermediate dielectric layer is formed at step 418, followed by a control gate layer at step 420. The intermediate dielectric layer is often, but not necessarily, a triple layer of oxide-nitride-oxide, which can be formed using a suitable deposition process. In one embodiment, spaces between strips of the charge storage material adjacent in the word line direction remain after filing the trenches at step 416. The intermediate dielectric layer can be formed over the upper surfaces of the strips of charge storage material as well as along the sidewalls of the strips of charge storage material. The intermediate dielectric layer along the sidewalls will partially occupy the spaces between adjacent strips of charge storage material, but does not completely fill the area. The control gate material can be formed over the dielectric layer above the strips of charge storage material and in the remaining spaces between adjacent strips. In this manner, the control gates will wrap around the floating gates on three sides for improved coupling. The control gate layer is a layer of conductive material, which in one embodiment can be polysilicon formed using a suitable deposition process.

After forming the control gate layer, the layer stack is patterned for forming rows of memory cells at step 422. Strips of photoresist can be formed over one or more masking and pad layers. The strips are elongated in the word line direction with spaces between strips adjacent in the bit line direction and correspond to the targeted rows of memory cells. At step 424, the control gate layer and intermediate dielectric layer are etched using the pattern to define word lines and rows of charge storage regions. At step 426, front end processing is completed, such as by interconnecting the floating gate and control gate regions of select and peripheral circuitry transistors. Peripheral gate connections can be formed using vias or contact holes, etc. to form contacts to individual gate regions or to connect multiple transistors to a common control line. The select gate transistors can have their floating gate regions shorted to the control gate regions to form a single gate structure. Array connections can also be patterned and formed. After forming contacts, etc., further backend processing to form metal layers, etc. to complete the device according to known techniques can be performed.

Figure 9A:
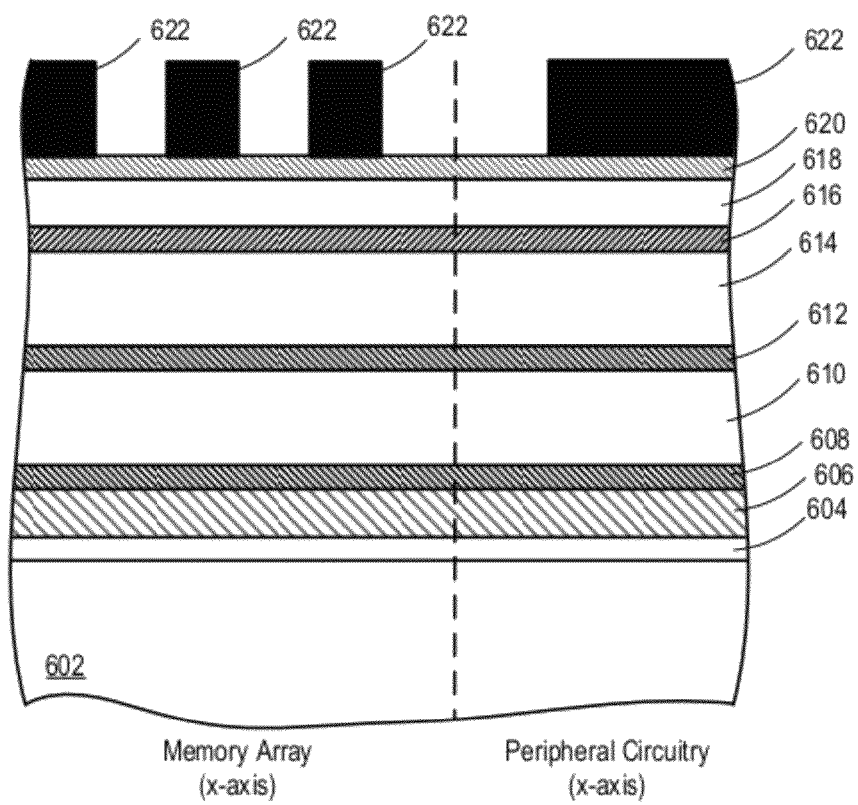
FIGS. 9A-9O are orthogonal cross-sectional views through a portion of a non-volatile memory array depicting a fabrication process in accordance with one embodiment.
Figure 9B:
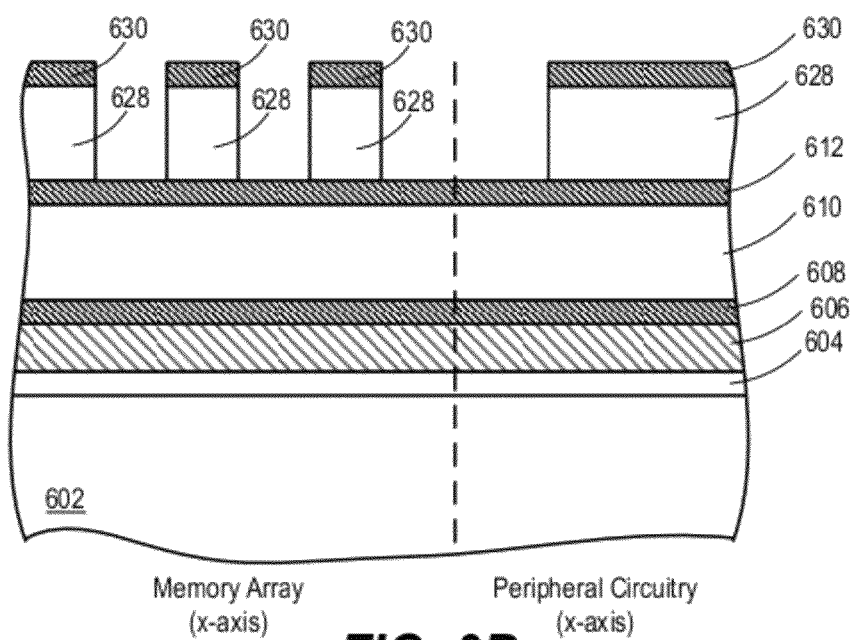
Figure 9C:
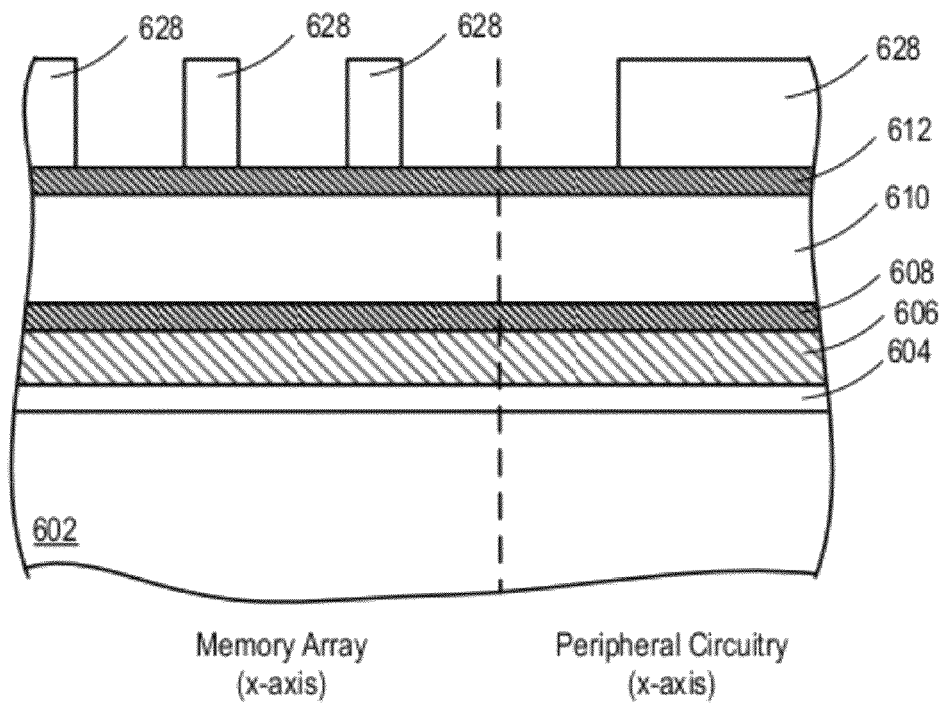
Figure 9D:
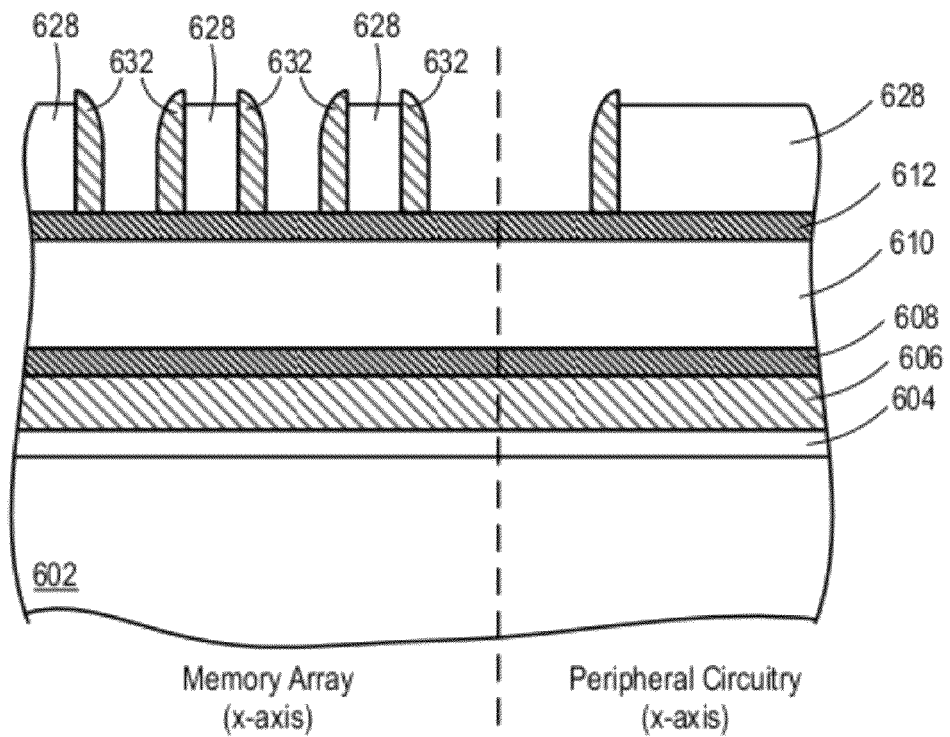
Figure 9E:
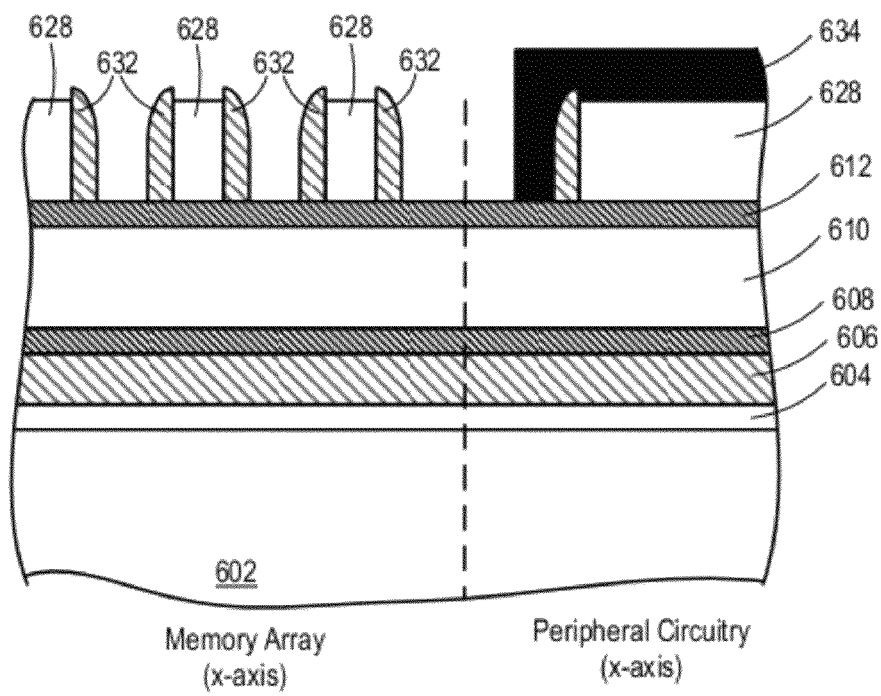
Figure 9F:
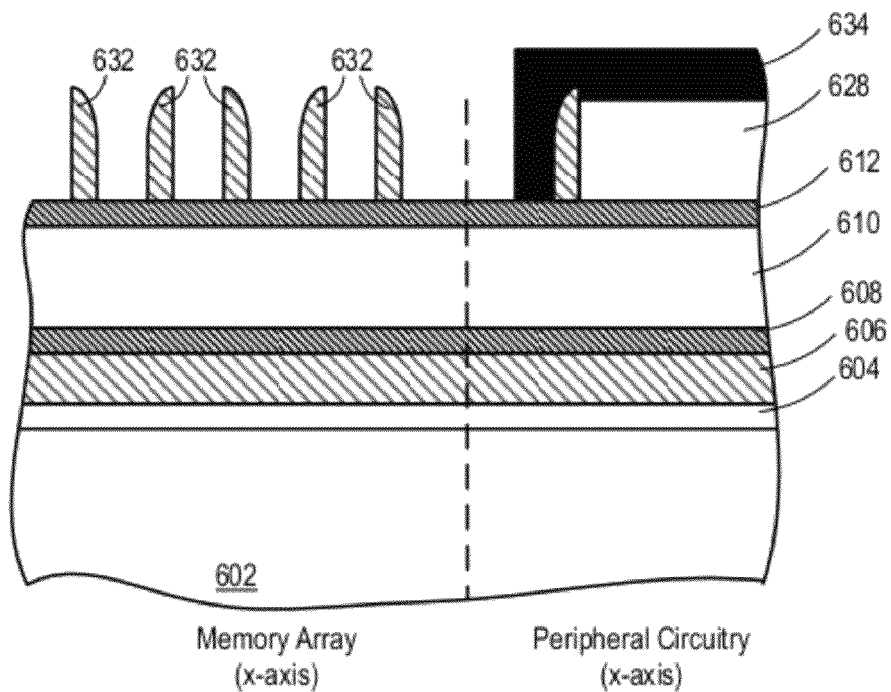
Figure 9G:
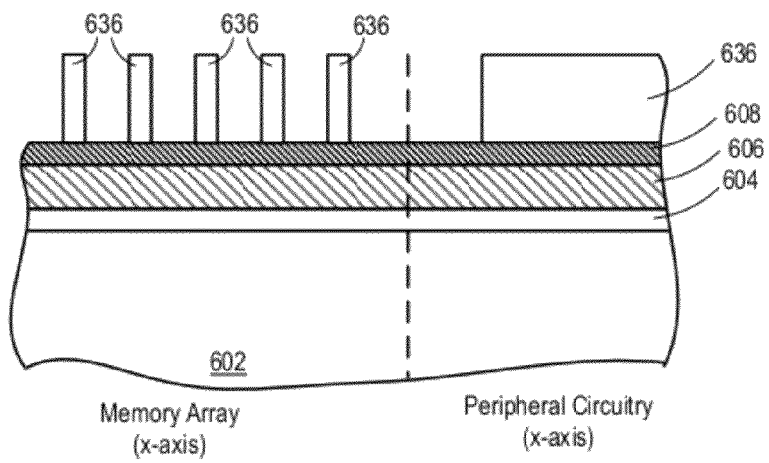
Figure 9H:
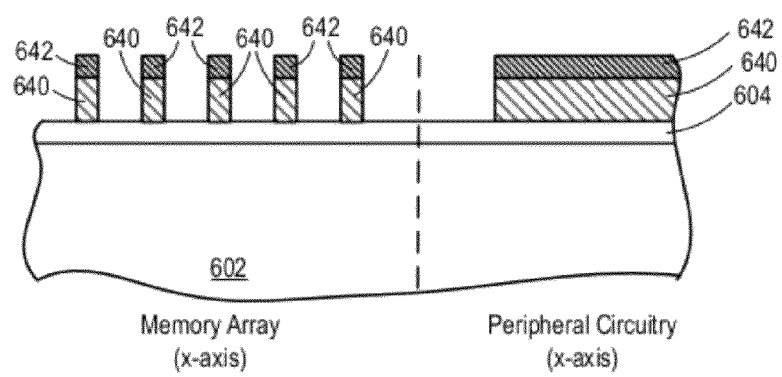
Figure 9I:
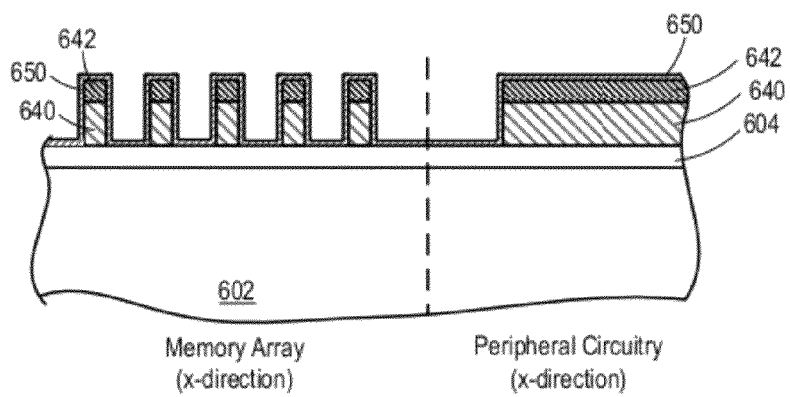
Figure 9J:
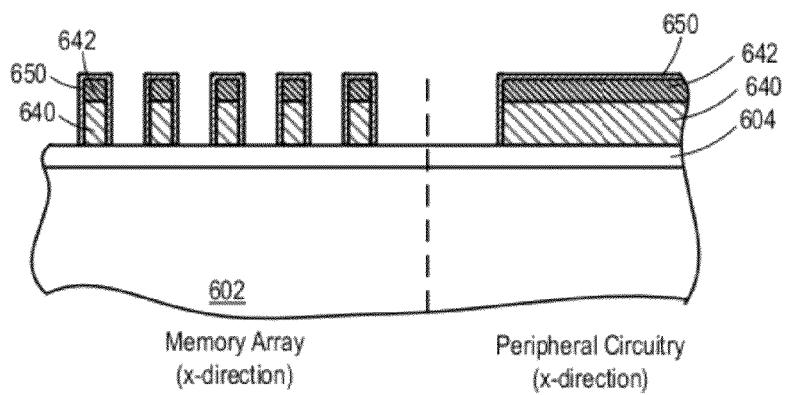
Figure 9K:
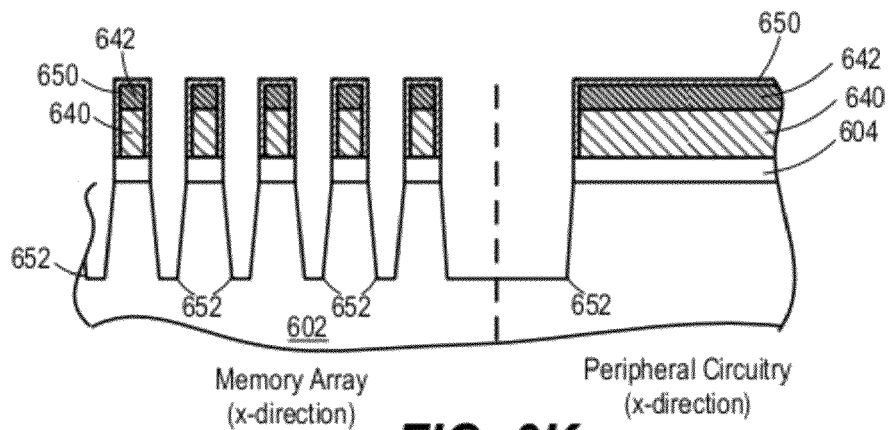
Figure 9L:
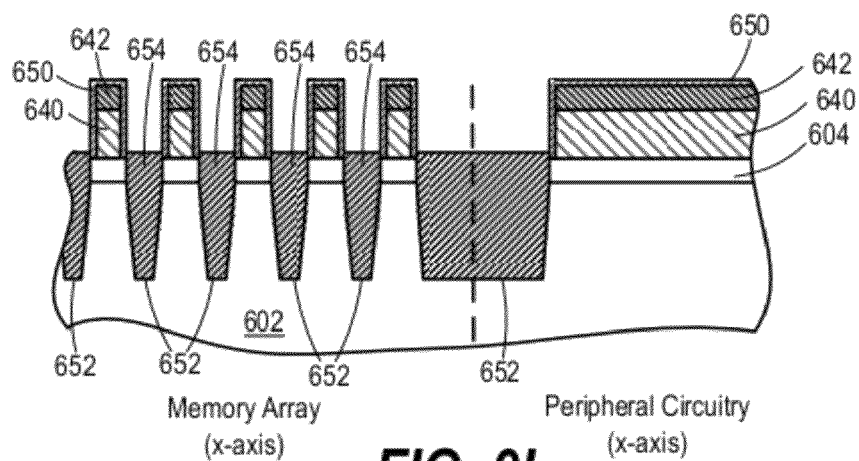
Figure 9M:
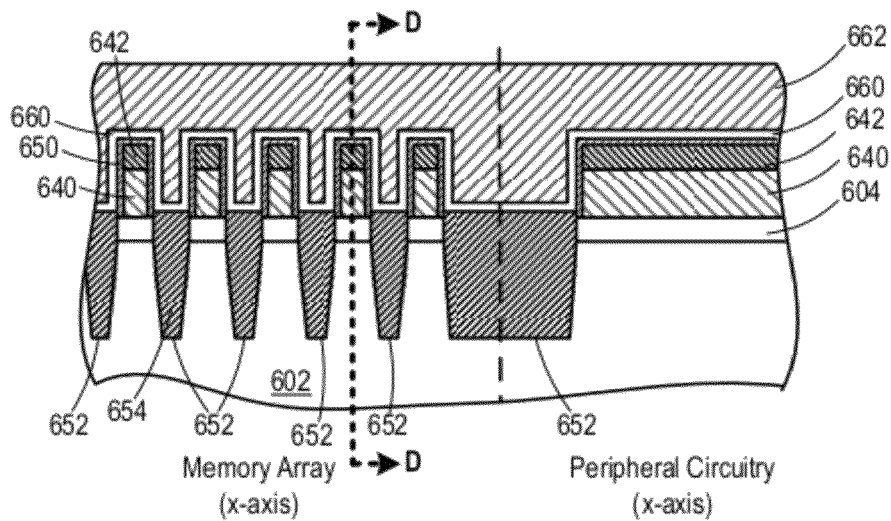
Figure 9N:
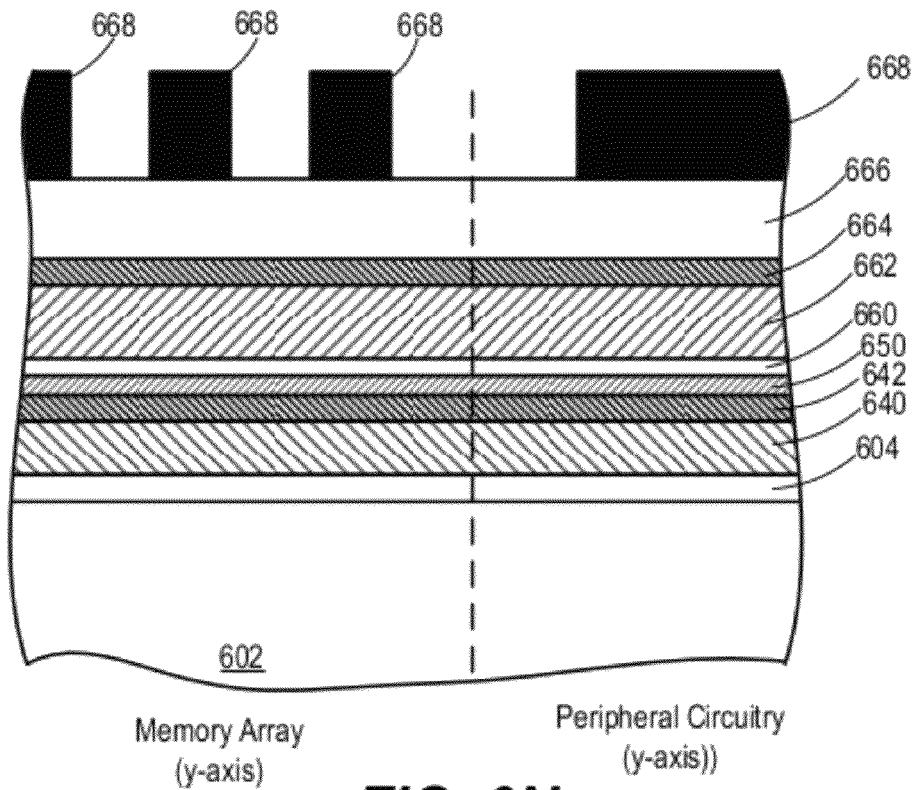
Figure 9O:
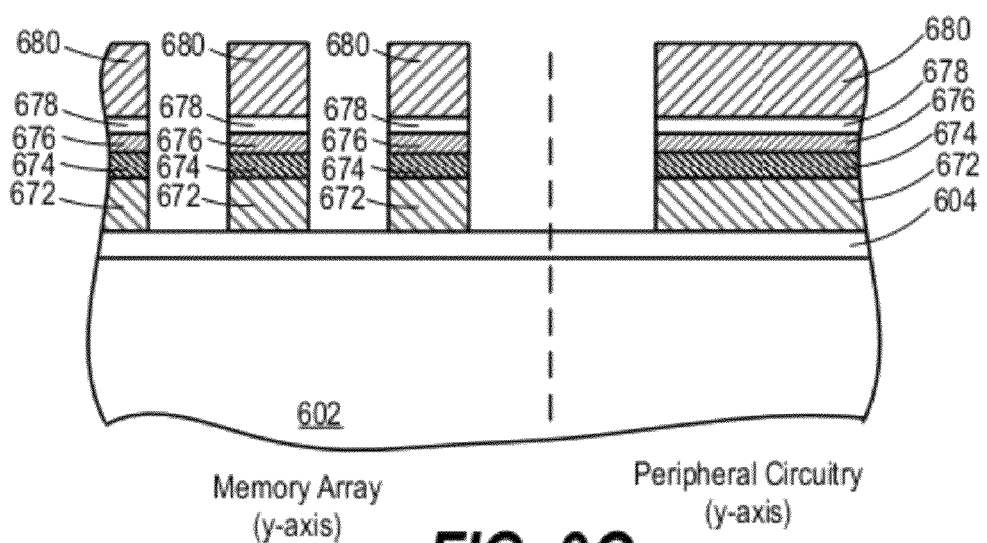

FIGS. 9A-9O are orthogonal cross-sectional views of portions of a non-volatile memory system depicting the fabrication of a memory array and peripheral circuitry in accordance with one embodiment. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

FIG. 9A is a cross-sectional view along the x-axis in the row or word line direction. FIG. 9A depicts a portion of the memory array region as well as a portion of the peripheral circuitry region. The peripheral circuitry region may include circuitry such as high voltage transistors, logic transistors, etc. that form part of the row or column control circuitry for the memory array as well as transistors for performing other functions. Although not depicted, one or more wells are (e.g., a triple well) are typically formed in substrate 602 prior to forming the layer stack over the substrate surface. A zero layer formation step may precede well formation. After implanting and associated annealing of the well(s) to dope the substrate, a layer 604 of tunnel dielectric material is formed over the substrate surface. A thin layer of oxide (e.g., $SiO_2$) is grown in one embodiment, although different materials and processes can be used. Chemical vapor deposition (CVD) processes, metal organic CVD processes, physical vapor depsotion (PVD) processes, atomic layer deposition (ALD) processes, thermal oxidation or other suitable techniques can be used. In one example, the tunnel oxide layer is formed to a thickness of about 8 nanometers (nm). Although not shown, one or more high voltage gate dielectric regions may be formed at the peripheral circuitry region before or after forming the tunnel dielectric layer. The high voltage gate dielectric regions may be formed with a larger thickness (e.g., 30-40 nm) than the tunnel dielectric layer.

A layer 606 of charge storage material is formed over the layer of tunnel dielectric material. It is noted that a layer may be said to be over another layer when one or more layers are between the two layers as well as when the two layers are in direct contact. The charge storage material is doped polysilicon in one embodiment, although undoped polysilicon can also be used. The layer of charge storage material is formed to a thickness of about 30 nm in one example. Dielectric charge storage materials, metal and non-metal nanostructures (e.g., carbon) can also be used for the layer of charge storage material.

A thin nitride (e.g., SiN) pad layer 608 is formed over the layer of charge storage material, followed by a thicker layer 610 of another pad material such as an oxide. In one embodiment, layer 608 is formed to a thickness of about 20 nm and layer 610 is formed to a thickness of about 100 nm. Layer 610 is a layer of tetraethyl orthosilicate (TEOS) in one example. A thin nitride (e.g., SiN) mask layer 612 is formed over the pad layer 610, followed by a layer 614 of sacrificial TEOS and a layer 616 of sacrificial high temperature oxide. In one embodiment, layer 612 is formed with a thickness of about 20 nm, layer 614 is formed with a thickness of about 90 nm and layer 616 is formed with a thickness of about 4 nm.

A pattern is then formed over the layer stack. The pattern is formed in one example using a stacked mass process, including a combination spin on glass (SOG) layer 620 and bottom antireflective layer 618 (e.g., octadecanol or carbon). Over SOG layer 620, strips 622 of photoresist are patterned and formed using traditional photolithographic processes. Strips 622 are elongated in the column direction at the memory array region with spaces between strips that are adjacent in the row direction. A single strip 622 is shown at the peripheral circuitry, but additional strips (not shown) may be included here as well.

The layer stack is then etched as shown in FIG. 9B. The SOG layer 620 and antireflective coating layer 616 are etched, followed by etching the high temperature oxide layer 616 and sacrificial TEOS layer 614 into strips 630 and 628, respectively. In one embodiment, reactive ion etching is used with various combinational etch chemistries to etch the different layers. Any suitable etch process(es) can be used. After etching the sacrificial TEOS layer 614, the photoresist strips 622 are removed, followed by the SOG layer 620 and antireflective coating layer 618. Any suitable process such as a chemical wet etch can be used to strip these layers after etching. Some portion of the pad nitride layer 612 may be etched during this process. After removing the photoresist, the strips 628 of sacrificial TEOS can be slimmed as shown in FIG. 9C to reduce the feature sizes if desired. Slimming removes the remaining portions of the strips 630 of high temperature oxide.

A layer of spacer material is formed over the substrate and etched back to form spacers 632 along the substantially vertical sidewalls of strips 628 as shown in FIG. 9D. A layer of polysilicon is deposited using conformal processes with a target thickness of, for example, 10 nm in one embodiment. The spacer material is etched back to form spacers 632 with a dimension in the row direction approximately equal to the target thickness of 10 nm. Etching back the spacer material exposes the underlying pad nitride layer 612 at portions not covered by strips 628 or spacers 632. In other embodiments, simple photolithography processes without spacer-patterning can be used, or other processes including nano-imprint technology may be used.

After forming spacers 632, a strip 634 of photoresist is formed over the strip 628 of sacrificial TEOS and spacer 632 at the peripheral circuitry region as shown in FIG. 9E. A wet etch process is then applied to remove the strips 628 of sacrificial TEOS at the memory array region as shown in FIG. 9F. After removing the strips, the strip 634 of photoresist at the peripheral circuitry region is removed, and the layer stack is etched as shown in FIG. 9G. At the memory array region, the spacers 632 server as mask, while at the peripheral circuitry, the spacer 632 and strip 628 of TEOS serve as a mask. Reactive ion etching is used in one embodiment although other etch processes can be used. Etching proceeds through the pad nitride layer 612 and pad TEOS layer 610, forming strips 636 of TEOS. Etching consumes the polysilicon spacers 632 and remaining portions of nitride layer 612.

After etching the oxide, the pad nitride layer 608 and charge storage layer 606 are etched into strips 642 and 640 as shown in FIG. 9H. Etching stops when the tunnel oxide layer 604 is reached. Any remaining portions of the strips 628 of TEOS are removed in a post clean process.

After forming the strips 640 of charge storage material and before etching to define isolation regions, a nitridation process is applied to form a protective encapsulating layer 650 along the vertical, or substantially vertical, sidewalls of the strips of charge storage material. The encapsulating layer in this example extends along the sidewalls of nitride strips 642 and over the exposed portions of the tunnel dielectric layer 604 as shown in FIG. 9I. The encapsulating layer is shown with a substantial thickness for illustrative purposes, but its actual thickness will be less than depicted in practice. The thickness of protective layer 650 is minimized in one embodiment to maximize the channel width under the strips of charge storage material overlying the active areas that are subsequently formed by etching the substrate. As earlier described, exposed portions of the tunnel dielectric layer 604 extending beyond the floating gate width can cause undesired tunneling effects under high electric fields. Accordingly, the width or thickness of the encapsulating layer can be minimized to reduce exposed portions of the underlying dielectric layer 604.

In one embodiment, the encapsulating layer is a nitride formed using slot plane antenna (nitridation). An antenna slot can be used to uniformly distribute a nitride species, forming a uniform layer along the vertical sidewalls of the strips of charge storage material. The layer is silicon nitride in one embodiment. In another embodiment, the layer is a silicon oxynitride layer. The encapsulating layer can be formed by reaction of the nitride species with the polysilicon charge storage material, thus minimizing any thickness of the resulting film. Given the charge trap capabilities of pure nitrides, a silicon oxynitride encapsulating layer is used in one embodiment. As earlier described, the thickness of the encapsulating layer can be less than 1 nm in one embodiment. In other embodiments, the encapsulating layer is between 1 nm and 2 nm or between 2 nm and 4 nm. Other thicknesses may be used, including thicknesses greater than 4 nm.

After forming encapsulating layer 650, the exposed portions overlying the horizontal portions of the tunnel dielectric layer are removed as shown in FIG. 9J. Reactive ion etching or other suitable process can be used. The tunnel dielectric layer 604 and substrate are then etched using additional reactive ion etching as shown in FIG. 9K. The substrate is etched to a depth of about 200 nm in one example although various depths can be used depending upon the requirements of a particular implementation. Etching forms shallow trench isolation trenches 652. The encapsulating layer 650 protects the sidewalls of the charge storage material from pull-back during the etch process and subsequent bowing as shown in FIGS. 6 and 7. The charge storage material sidewalls are protected from oxidation and attack by the different etch chemicals used in the different etch processes. After etching the isolation regions, a post clean process is typically applied. The encapsulating layer protects the charge storage material from damage during the cleaning process. Although not shown, the substrate at the isolation trenches typically undergoes bulk implant of ions prior to further processing.

The isolation trenches are filled with an insulating material 654 such as $SiO_2$ as shown in FIG. 9L. In one embodiment, a layer of high temperature oxide is deposited as a liner in the trenches, before filling the trenches with $SiO_2$. In one embodiment, the isolation trenches are filled with partially stabilized zirconia (PSZ). CVD, rapid ALD or other suitable processes can be used. Chemical mechanical polishing (CMP), or another suitable process, can be applied to polish the isolation material until reaching the strips of nitride, resulting in a substantially planar surface. The insulating material is then etched back or recessed to about the upper surface of the tunnel dielectric layer 604.

After recessing insulating material 654, an intermediate dielectric layer 660 is formed over the substrate as shown in FIG. 9M. In one embodiment the intermediate dielectric layer is a triple layer of oxide-nitride-oxide formed to a thickness of about 3-6 nm, although various materials and thicknesses may be used. Conformal deposition processes are used in one embodiment so that the intermediate dielectric layer is formed to a substantially even thickness along the encapsulating layer 650 at the sidewalls of the charge storage material and over the nitride layer. After forming the intermediate dielectric layer, a control gate layer 662 is formed over the intermediate dielectric layer. The control gate layer is a layer of polysilicon in one example, formed to a depth of about 100 nm, although various materials (e.g., metal) can be used and formed to different thicknesses. After depositing the control gate layer, chemical mechanical polishing can be applied to create a planar upper surface for further processing steps.

FIG. 9N is a cross-sectional view taken through line D-D of FIG. 9M along the y-axis, showing part of a column of memory cells and the peripheral circuitry region in y-axis cross-section. A simple pattern including a layer of padding material 664, (e.g., nitride) and a sacrificial layer 666 (e.g., oxide) are formed over the control gate layer 662 along with strips 668 of photoresist in the memory array region and the peripheral circuitry region. In other embodiments, spacer-assisted patterning as earlier described for isolation region formation can be used.

Using the photoresist as a mask, the layer stack is etched as shown in FIG. 9O. Etching the control gate layer forms control gates 680 and etching the strips 640 of charge storage material forms floating gates 672. The intermediate dielectric layer 660 is etched into strips 678 and nitride strips 642 are etched into nitride caps 678 at the top of each floating gate 672. After etching, the photoresist, the sacrificial and pad layers are removed. Final Processing steps can include forming openings, contacts and vias, etc., shorting the control gate 680 and floating gate regions 672 at the peripheral circuitry and select gate regions to form gate transistors. Processing of metal layers and contacts is then performed, including forming contacts to word lines, etc.

Figure 10A:
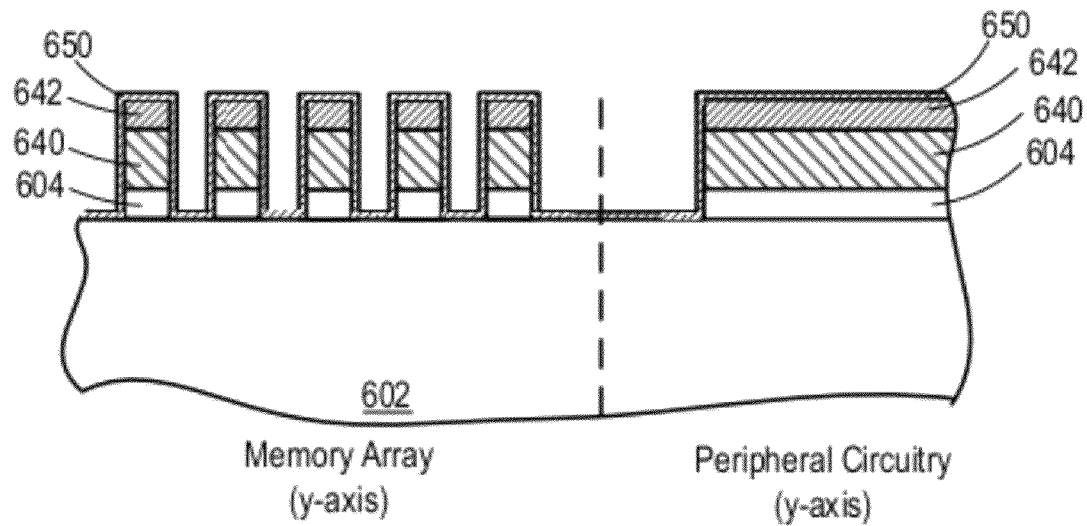
FIGS. 10A-10B are cross-sectional views through a portion of a non-volatile memory array depicting a fabrication process in accordance with one embodiment.
Figure 10B:
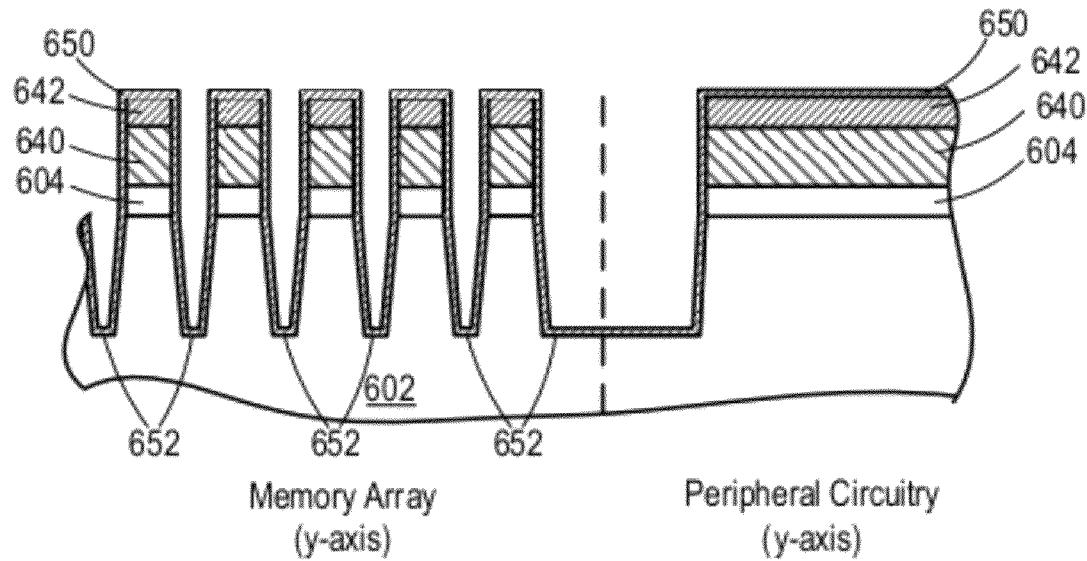

FIGS. 10A-10B are cross-sectional views in the row direction along the x-axis showing another technique for the fabrication shown in FIGS. 9H-9K. A flow of nitride species is added to the etch chemistry while etching nitride layer 608, charge storage layer 606, tunnel dielectric layer 604 and the substrate to form isolation trenches 652. Nitride species can flow with the various etch chemistries to react with the nitride layer 608, charge storage layer 606 and tunnel dielectric layer 604 to begin forming encapsulating layer 650 as shown in FIG. 10A. Flowing nitride species simultaneously while etching does not require a separate machine as required for SPA nitridation, for example.

Etching continues into the substrate while continuing the flow of nitride species during the etch sequence as shown in FIG. 10B. Isolation trenches are simultaneously formed while continuing to form encapsulating layer 650. Encapsulating layer 650 lines the trenches and sidewalls of the strips of the charge storage material and nitride layer. Processing then continues as shown in FIG. 9L, with the addition of the encapsulating layer as a liner in the trench regions.

Figure 11:
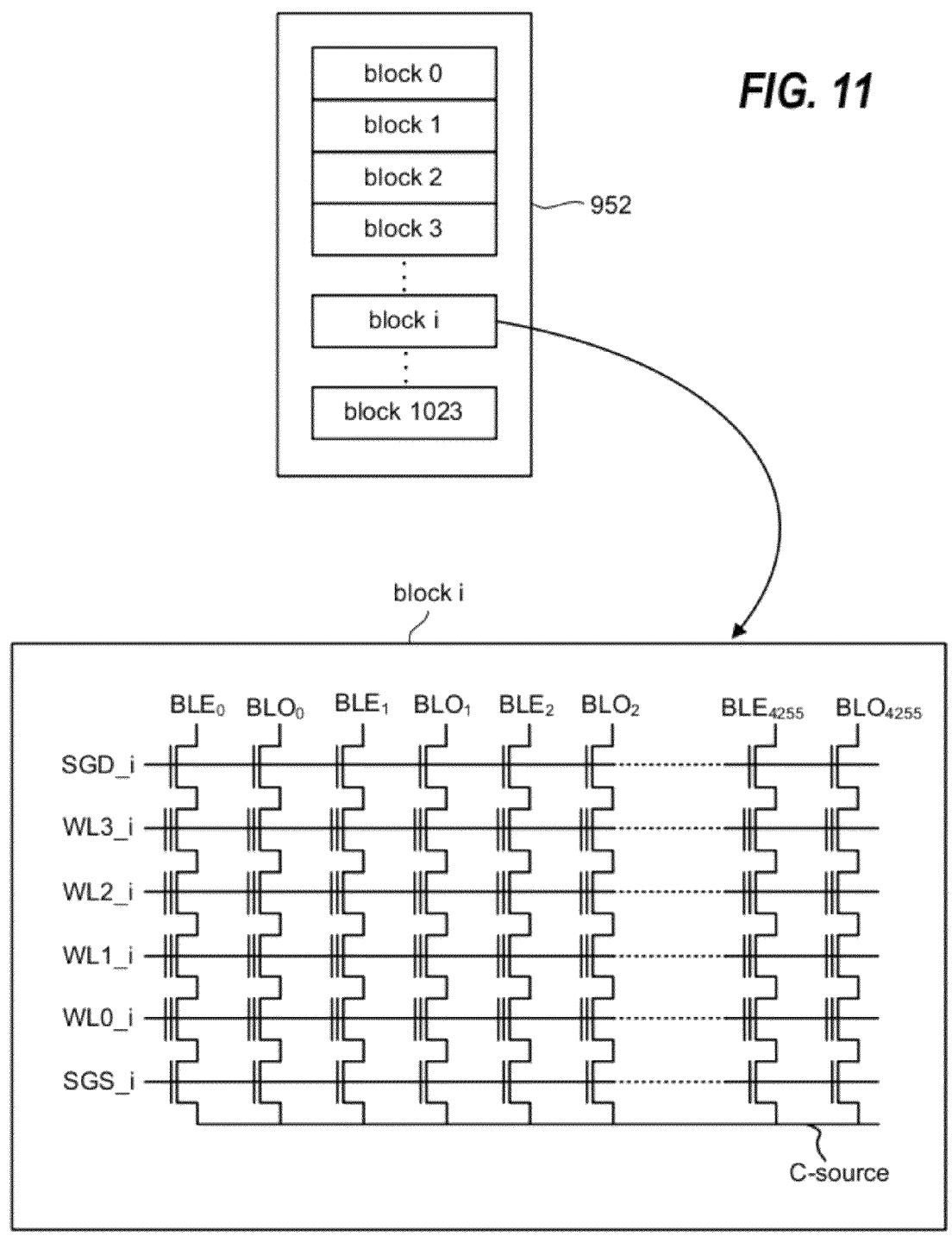
FIG. 11 depicts an example of the organization of a memory array in accordance with one embodiment.

FIG. 11 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 11 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 12:
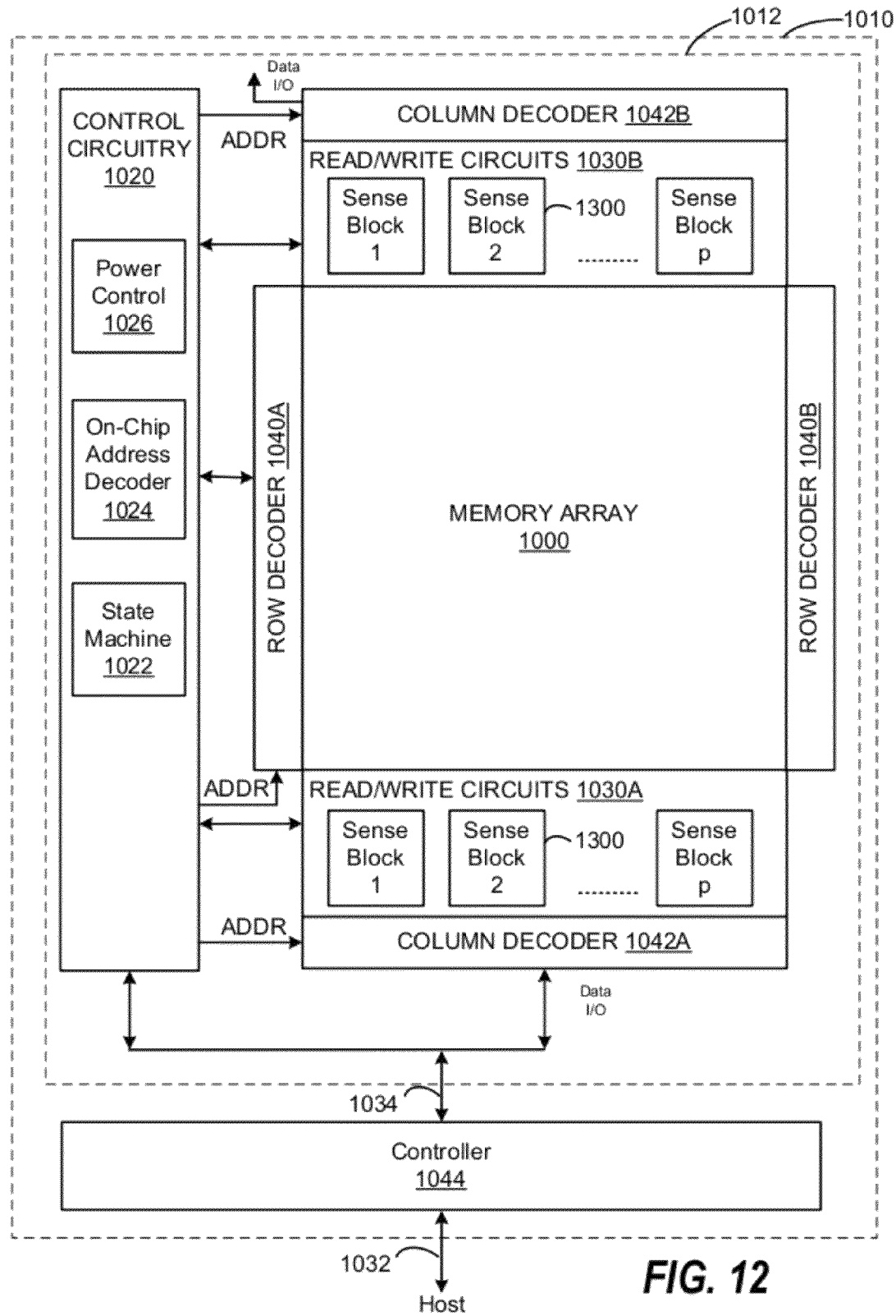
FIG. 12 is a block diagram depicting an example of a memory system that can be fabricated or used to implement embodiments of the disclosed technology.

FIG. 12 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 13:
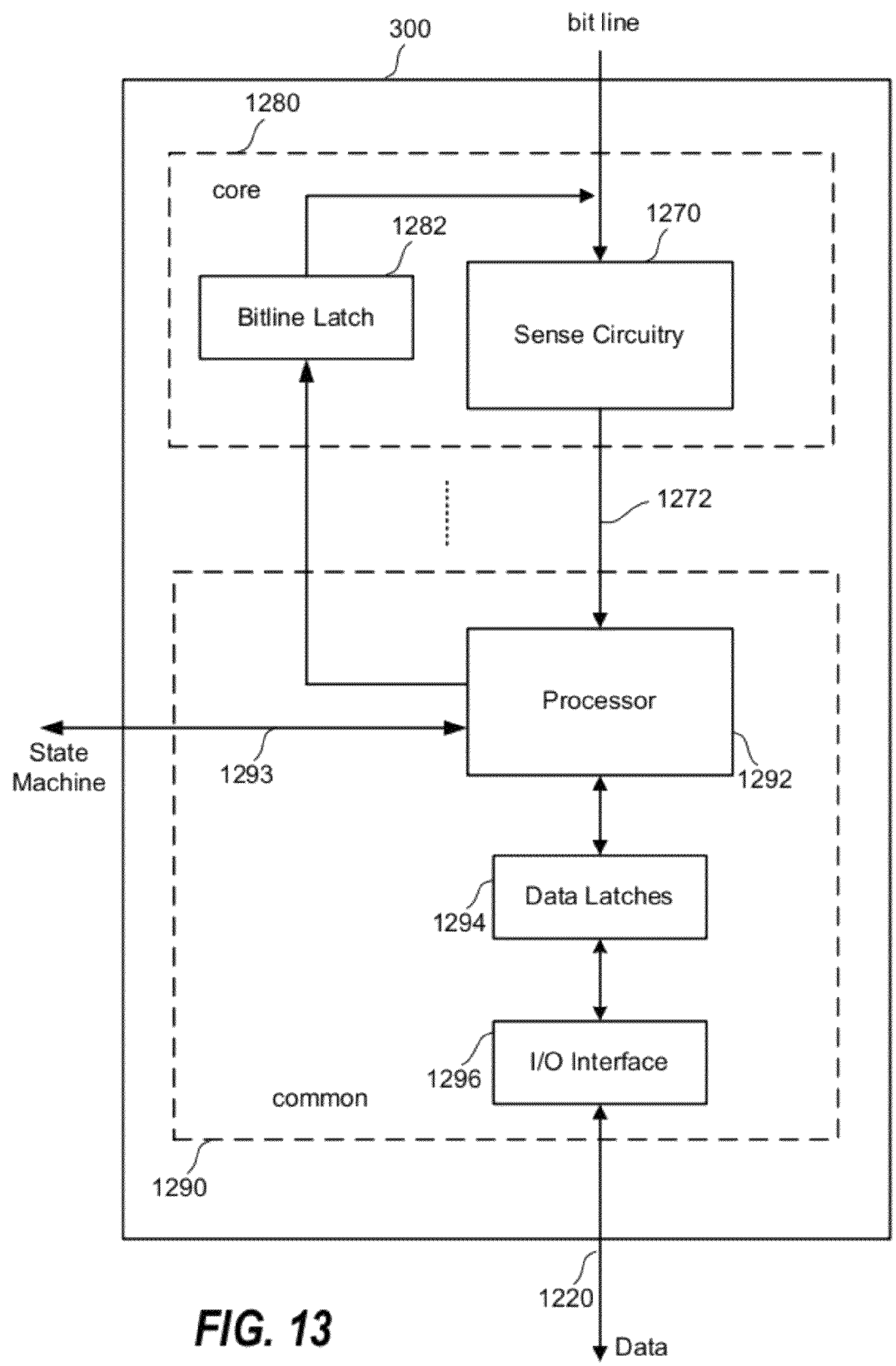
FIG. 13 is a block diagram depicting one embodiment of a sense block.

FIG. 13 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220.

The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

There has therefore been described a method of fabricating non-volatile memory in one embodiment that includes forming a layer of dielectric material over a substrate, forming a layer of charge storage material over the layer of dielectric material, etching the layer of charge storage material according to a first pattern to form strips of charge storage material having sidewalls elongated in a first direction over the substrate, forming an encapsulating layer along the sidewalls of the strips of charge storage material using a nitridation process, and etching the layer of dielectric material and the substrate between portions of the encapsulating layer on the sidewalls of adjacent strips of charge storage material to form isolation trenches that define active areas in the substrate at areas underlying the strips of charge storage material.

There has further been described a method of fabricating non-volatile memory that includes forming a layer of dielectric material over a substrate, forming a layer of charge storage material over the layer of dielectric material, etching the layer of charge storage material while introducing nitrogen species to form strips of the charge storage material having sidewalls with an encapsulating layer disposed thereon. The sidewalls and encapsulating layer are elongated in a first direction across the substrate. The method further includes etching the layer of dielectric material and the substrate between portions of the encapsulating layer on the sidewalls of adjacent strips of charge storage material. The etching forms strips of dielectric material and isolation trenches that define active areas in the substrate at areas underlying the strips of charge storage material. The trenches and active areas are elongated in a second direction that is perpendicular to the first direction.

A non-volatile memory array has been described that includes a plurality of columns of charge storage regions overlying a substrate with a layer of dielectric material therebetween. The charge storage regions of columns adjacent in a row direction have sidewalls that extend in a column direction. The row direction is perpendicular to the column direction. An encapsulating oxynitride film overlies the sidewalls of the charge storage regions. A plurality of isolation trenches are formed in the substrate between columns of charge storage regions adjacent in the row direction. The isolation trenches are filled with an insulating material. An intermediate dielectric layer overlies the charge storage regions and a plurality of word lines extend over a row of charge storage regions with the intermediate dielectric layer therebetween.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile memory, comprising:
    forming a layer of dielectric material over a substrate;
    forming a layer of charge storage material over the layer of dielectric material;
    etching the layer of charge storage material according to a first pattern to form strips of charge storage material having sidewalls elongated in a first direction over the substrate;
    forming a silicon oxynitride encapsulating layer along the sidewalls of the strips of charge storage material using a nitridation process;
    etching the layer of dielectric material and the substrate between portions of the encapsulating layer on the sidewalls of adjacent strips of charge storage material, the etching forming isolation trenches to define active areas in the substrate at areas underlying the strips of charge storage material;
    filling the isolation trenches with an insulating material;
    recessing the insulating material between adjacent strips of the charge storage material;
    forming an intermediate dielectric layer and a control gate layer after recessing the insulating material;
    forming patterning strips elongated in a second direction over the control gate layer; and
    etching the control gate layer and the intermediate dielectric layer using the patterning strips to define a plurality of word lines from the control gate layer and a plurality of charge storage regions from each strip of charge storage material.

2. A method according to claim 1, wherein:
    forming the silicon oxynitride encapsulating layer includes performing a slot plane antenna nitridation process to introduce nitrogen species to the sidewalls of the strips of charge storage material, the nitrogen species reacting with the charge storage material to form the silicon oxynitride encapsulating layer.

3. A method according to claim 1, wherein:
    the charge storage material is polysilicon.

4. A method according to claim 1, wherein:
    the non-volatile memory is a NAND flash memory array.

5. A method according to claim 1, wherein the silicon oxynitride encapsulating layer has a thickness of less than 4 nanometers.

6. A method according to claim 5, wherein the thickness is between 2 nanometers and 4 nanometers.

7. A method of fabricating non-volatile memory, comprising:
    forming a layer of dielectric material over a substrate;
    forming a layer of charge storage material over the layer of dielectric material;
    etching the layer of charge storage material while introducing nitrogen species to form strips of the charge storage material having sidewalls with an encapsulating layer disposed thereon, the sidewalls and encapsulating layer elongated in a first direction across the substrate; and
    etching the layer of dielectric material and the substrate between portions of the encapsulating layer on the sidewalls of adjacent strips of charge storage material, the etching forming strips of dielectric material and isolation trenches that define active areas in the substrate at areas underlying the strips of charge storage material, the trenches and active areas elongated in a second direction that is perpendicular to the first direction;
    wherein etching the layer of dielectric material and the substrate includes introducing nitrogen species such that the encapsulating layer extends vertically along sidewalls of the isolation trenches and sidewalls of the strips of dielectric material.

8. A method according to claim 7, wherein the encapsulating layer has a thickness of less than 8 nanometers.

9. A method according to claim 8, wherein the thickness is between 2 nanometers and 4 nanometers.

10. A method according to claim 7, wherein:
    the encapsulating layer includes a nitride.

11. A method according to claim 10, wherein:
    the encapsulating layer includes an oxide.

12. A method according to claim 7, further comprising:
    filling the isolation trenches with an insulating material.

13. A method according to claim 12, further comprising:
    recessing the insulating material between adjacent strips of the charge storage material;
    forming an intermediate dielectric layer and a control gate layer after recessing the insulating material;
    forming a mask including patterning strips elongated in a second direction over the control gate layer;
    etching the control gate layer and the intermediate dielectric layer using the patterning strips to define a plurality of word lines from the control gate layer and a plurality of charge storage regions from each strip of charge storage material.

14. A method according to claim 13, wherein:
the charge storage regions formed from each strip of charge material include at least one NAND string of serially connected non-volatile storage elements.

15. A method of fabricating non-volatile memory, comprising:
forming a layer of dielectric material over a substrate;
forming a layer of charge storage material over the layer of dielectric material;
etching the layer of charge storage material according to a first pattern to form strips of charge storage material having sidewalls elongated in a first direction over the substrate;
forming a silicon oxynitride encapsulating layer along the sidewalls of the strips of charge storage material using a nitridation process; and
etching the layer of dielectric material and the substrate between portions of the encapsulating layer on the sidewalls of adjacent strips of charge storage material, the etching forming strips of dielectric material and isolation trenches that define active areas in the substrate at areas underlying the strips of charge storage material.
wherein etching the layer of dielectric material and the substrate includes introducing nitrogen species such that the silicon oxynitride encapsulating layer extends vertically along sidewalls of the isolation trenches and sidewalls of the strips of dielectric material.

16. A method according to claim 15, further comprising:
filling the isolation trenches with an insulating material;
recessing the insulating material between adjacent strips of the charge storage material;
forming an intermediate dielectric layer and a control gate layer after recessing the insulating material;
forming patterning strips elongated in a second direction over the control gate layer;
etching the control gate layer and the intermediate dielectric layer using the patterning strips to define a plurality of word lines from the control gate layer and a plurality of charge storage regions from each strip of charge storage material.

17. A method of fabricating non-volatile memory, comprising:
forming a layer of dielectric material over a substrate;
forming a layer of charge storage material over the layer of dielectric material;
etching the layer of charge storage material while introducing nitrogen species to form strips of the charge storage material having sidewalls with an encapsulating layer disposed thereon, the sidewalls and encapsulating layer elongated in a first direction across the substrate;
etching the layer of dielectric material and the substrate between portions of the encapsulating layer on the sidewalls of adjacent strips of charge storage material, the etching forming strips of dielectric material and isolation trenches that define active areas in the substrate at areas underlying the strips of charge storage material, the trenches and active areas elongated in a second direction that is perpendicular to the first direction;
recessing the insulating material between adjacent strips of the charge storage material;
forming an intermediate dielectric layer and a control gate layer after recessing the insulating material;
forming patterning strips elongated in a second direction over the control gate layer;
etching the control gate layer, the intermediate dielectric layer, and the strips of charge storage material using the patterning strips to define a plurality of word lines from the control gate layer and a plurality of charge storage regions from each strip of charge storage material.

18. A method according to claim 17, wherein:
the charge storage regions formed from each strip of charge material include at least one NAND string of serially connected non-volatile storage elements.

* * * * *

UNITED STATES PATENT AND TRADEMARK OFFICE
CERTIFICATE OF CORRECTION

PATENT NO.           : 8,288,293 B2                                    Page 1 of 1
APPLICATION NO.      : 12/763963
DATED                : October 16, 2012
INVENTOR(S)          : Pham et al.

It is certified that error appears in the above-identified patent and that said Letters Patent is hereby corrected as shown below:

In the Claims:

Col. 17, in Claim 15, line 26: After "material" delete "." and insert -- ; --

Signed and Sealed this
Fifth Day of March, 2013

Teresa Stanek Rea
*Acting Director of the United States Patent and Trademark Office*